(12) United States Patent
Rubin et al.

(10) Patent No.: US 12,742,626 B2
(45) Date of Patent: Sep. 22, 2026

(54) PRECISION STYLUS CONTROL SYSTEM

(71) Applicant: KLA Corporation, Milpitas, CA (US)

(72) Inventors: Kurt Rubin, Santa Clara, CA (US); Chris Persico, Simi Valley, CA (US); Oskar Amster, Milpitas, CA (US)

( * ) Notice: Subject to any disclaimer, the term of this patent is extended or adjusted under 35 U.S.C. 154(b) by 340 days.

(21) Appl. No.: 18/630,778

(22) Filed: Apr. 9, 2024

(65) Prior Publication Data

US 2024/0353214 A1 Oct. 24, 2024

Related U.S. Application Data

(60) Provisional application No. 63/460,988, filed on Apr. 21, 2023.

(51) Int. Cl.
*G01B 5/28* (2006.01)
*G01R 19/10* (2006.01)
*G05D 3/12* (2006.01)

(52) U.S. Cl.
CPC ............... *G01B 5/28* (2013.01); *G01R 19/10* (2013.01); *G05D 3/124* (2013.01)

(58) Field of Classification Search
CPC ........... G01B 5/28; G01R 19/10; G05D 3/124
USPC ........................................................... 33/533
See application file for complete search history.

(56) References Cited

U.S. PATENT DOCUMENTS 4,873,994 A * 10/1989 Anger ...................... G01L 5/00
600/587
5,804,710 A 9/1998 Mamin et al.
5,847,270 A * 12/1998 Nettleton ............... G01B 5/012
73/866.5
5,955,661 A 9/1999 Samsavar et al.
6,085,581 A 7/2000 Jones et al.
6,314,800 B1 11/2001 Nishimura
6,392,229 B1 5/2002 Dana et al.
6,901,677 B2 6/2005 Smith et al.
6,943,968 B2 9/2005 Nielson et al.
7,375,324 B2 5/2008 Linder et al.
(Continued)

FOREIGN PATENT DOCUMENTS

EP 0790482 A1 8/1997
JP 2004079733 A 3/2004
KR 20120028012 A 3/2012

OTHER PUBLICATIONS

"Topography Sensor Technology for Stylus Profilers," KLA Instruments, 2021.

(Continued)

*Primary Examiner* — George B Bennett
(74) *Attorney, Agent, or Firm* — Hodgson Russ LLP

(57) ABSTRACT

The system includes a processor configured to energize a pair of torque coils with a force signal to generate a magnetic force between the pair of torque coils and an internal magnet of a control arm disposed between the pair of torque coils. The control arm is connected to a probe arm, and the magnetic force causes the control arm and the probe arm to rotate about a pivot joint and causes a probe tip of the probe arm to contact a surface of a sample. After energizing the sensing subsystem with an excitation signal, the processor receives a sensing signal difference from the sensing subsystem that is proportional to the rotational position of the control arm, which corresponds to a height of the probe tip relative to the surface of the sample.

20 Claims, 6 Drawing Sheets

(56) References Cited

U.S. PATENT DOCUMENTS

| | | | | |
|---|---|---|---|---|
| 9,518,811 | B2 * | 12/2016 | Yamamoto | G01B 3/008 |
| 10,241,638 | B2 | 3/2019 | Issayeva et al. | |
| 10,571,238 | B2 * | 2/2020 | Morii | G01B 3/008 |
| 10,794,678 | B2 * | 10/2020 | Brenner | G01Q 60/38 |
| 11,353,318 | B2 | 6/2022 | Jiang et al. | |
| 11,435,174 | B2 * | 9/2022 | Rudkowski | G01B 5/0004 |
| 2008/0011065 | A1 | 1/2008 | Su et al. | |
| 2014/0331511 | A1 | 11/2014 | Yamauchi et al. | |
| 2019/0242702 | A1 | 8/2019 | Singh et al. | |
| 2021/0033392 | A1 * | 2/2021 | Omori | G01B 21/042 |
| 2024/0159509 | A1 * | 5/2024 | Sulz | G01B 5/008 |

OTHER PUBLICATIONS

Mahadeshwara, "Stylus Profilometer," Tribology, 2022.

WIPO, International Search Report issued for PCT/US2024/024699, Jul. 25, 2024.

* cited by examiner

PRECISION STYLUS CONTROL SYSTEM

CROSS-REFERENCE TO RELATED APPLICATIONS

This application claims priority to the provisional patent application filed Apr. 21, 2023, and assigned U.S. Appl. No. 63/460,988, the disclosure of which is hereby incorporated by reference.

FIELD OF THE DISCLOSURE

This disclosure relates to stylus profilometry systems for measurement and testing of surface topographies for research, development and manufacturing.

BACKGROUND OF THE DISCLOSURE

Evolution of the manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a manufacturer.

As an example of manufacturing challenges, fabricating semiconductor devices, such as logic and memory devices, typically includes processing a sample, such as a semiconductor wafer, using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Metrology processes are used at various steps during semiconductor manufacturing to monitor and control the process. Metrology processes are different than inspection processes in that, unlike inspection processes in which defects are detected on wafers, metrology processes are used to measure one or more characteristics of the wafers that cannot be determined using existing inspection tools. Metrology processes can be used to measure one or more characteristics of wafers such that the performance of a process can be determined from the one or more characteristics. For example, metrology processes can measure a dimension (e.g., line width, thickness, etc.) of features formed on the wafers during the process. In addition, if the one or more characteristics of the wafers are unacceptable (e.g., out of a predetermined range for the characteristic(s)), the measurements of the one or more characteristics of the wafers may be used to alter one or more parameters of the process such that additional wafers manufactured by the process have acceptable characteristic(s).

Some metrology processes utilize a stylus or probe to measure the surface of a sample. For example, the stylus can be placed in contact with the surface of the sample and scan across the sample to measure its topography and dimensions of surface features, or indentation and scratch tests can be performed by applying a force to the surface of the sample with the stylus. However, stylus profilometry systems that are open loop, lack feedback from a mechanism that senses the stylus position that can be applied to the mechanisms that control the force and positioning of the stylus. Accordingly, measurement sensitivity and force control are dependent on system calibration, and the open loop system has low adaptability to different operating modes, measurements of different samples or real-time changes to the measurement environment. In addition, separate system configurations and calibrations are needed to perform force and position measurements. Those separate configurations and calibrations are disconnected to any changes to the stylus or the environment that occur subsequently. For example, an open loop force control system is challenged by being insensitive to temperature-induced drift of the applied force.

Therefore, what is needed is a stylus profilometry system that is closed loop with integrated force and position control.

BRIEF SUMMARY OF THE DISCLOSURE

An embodiment of the present disclosure provides a system. The system may comprise a probe arm comprising a probe tip. The probe tip may be configured to contact a surface of a sample.

The system may further comprise a control arm connected to the probe arm. The control arm may include an internal magnet.

The system may further comprise one or more torque coils disposed on opposite sides of the control arm. The one or more torque coils may be configured to cause rotation of the control arm about a pivot joint based on interaction with the internal magnet.

The system may further comprise a sensing subsystem. The sensing subsystem may be configured to measure a rotational position of the control arm.

The system may further comprise a processor in electronic communication with the one or more torque coils and the sensing subsystem. The processor may be configured to energize at least one of the one or more torque coils with a force signal to generate a magnetic force between the one or more torque coils and the internal magnet, which causes the control arm to rotate about the pivot joint, thereby causing the probe arm connected to the control arm to rotate about the pivot joint and causing the probe tip to contact the surface of the sample. The processor may be further configured to energize the sensing subsystem with an excitation signal. The processor may be further configured to receive a sensing signal difference from the sensing subsystem that is proportional to the rotational position of the control arm, which corresponds to a height of the probe tip relative to the surface of the sample. The sensing signal difference may be a voltage difference or a current difference.

In some embodiments, the processor may include a servo loop integrator. The servo loop integrator may be configured to apply the rotational position of the control arm determined from the sensing subsystem as feedback to control the force signal.

In some embodiments, the processor may be further configured to determine an adjusted force signal based on feedback from the rotational position or force of the control arm to produce a preset force; and energize at least one of the one or more torque coils with the adjusted force signal, thereby causing the probe tip to contact the surface of the sample with the preset force.

In some embodiments, the processor may be further configured to determine an adjusted force signal based on the feedback from the rotational position or force of the control arm to position the probe tip at a preset height; energize at least one of the one or more torque coils with the adjusted force signal, thereby causing the probe tip to be positioned at the preset height relative to the surface of the sample; and confirm that the probe tip is positioned at the preset height based on the sensing signal difference received from the sensing subsystem.

In some embodiments, the processor may be further configured to generate a modulated force signal; and energize at least one of the one or more torque coils with the modulated force signal, thereby causing the height of the probe tip to oscillate relative to the surface of the sample.

In some embodiments, the sensing subsystem may comprise a primary coil and a pair of secondary coils disposed on opposite sides of the primary coil. A core of the pivot joint may be surrounded by the primary coil and the pair of secondary coils, such that a change in the rotational position of the control arm may cause the core to move within the primary coil and the pair of secondary coils, and the sensing signal difference measured from the pair of secondary coils may be proportional to the position of the core.

In some embodiments, the primary coil and the pair of secondary coils may be coaxial, and the core may move linearly within the primary coil and the pair of secondary coils.

In some embodiments, the primary coils and the pair of secondary coils may be cocircular, and the core may move angularly within the primary coil and the pair of secondary coils.

In some embodiments, the sensing subsystem may comprise a primary coil and a secondary coil disposed opposite to the primary coil. A core of the control arm may be disposed between the primary coil and the secondary coil, such that a change in the rotational position of the control arm may cause the core to move between the primary coil and the secondary coil, and the sensing signal difference measured from the secondary coil may be proportional to the position of the core.

In some embodiments, the system may further comprise an external magnet. The external magnet may be configured to attract the internal magnet of the control arm, which may cause the control arm to rotate to a retracted position, in which the probe tip may be spaced apart from the surface of the sample. The one or more torque coils may be configured to cause rotation of the control arm against the attraction of the external magnet.

In some embodiments, the external magnet may be movable between a first position and a second position. In the first position, the external magnet may be proximal to the internal magnet to attract the internal magnet of the control arm, and in the second position, the external magnet may be distal from the internal magnet to allow free rotation of the control arm.

In some embodiments, the pivot joint may include a torsion bar configured to bias the control arm toward a neutral position. In the neutral position, the probe tip may be spaced apart from the surface of the sample, and the one or more torque coils may be configured to cause rotation of the control arm against the bias of the torsion bar.

In some embodiments, the processor may be further configured to energize one of the one or more torque coils with the force signal to control a direction that the control arm rotates about the pivot joint based on the magnetic force.

Another embodiment of the present disclosure provides a method. The method may comprise energizing a pair of torque coils with a force signal to generate a magnetic force between the pair of torque coils and an internal magnet of a control arm disposed between the pair of torque coils. The control arm may be connected to a probe arm, and the magnetic force may cause the control arm and the probe arm to rotate about a pivot joint and may cause a probe tip of the probe arm to contact a surface of a sample. Energizing one torque coil of the pair of torque coils with the force signal may control a direction that the control arm rotates about the pivot joint based on the magnetic force.

The method may further comprise energizing a sensing subsystem with an excitation signal; measuring a sensing signal difference from the sensing subsystem that is proportional to a rotational position of the control arm, wherein the sensing signal difference is a voltage difference or a current difference; and determining a height of the probe tip relative to the surface of the sample based on the rotational position of the control arm.

In some embodiments, the method may further comprise applying the rotational position of the control arm determined from the sensing subsystem as feedback in a servo loop to control the force signal.

In some embodiments, the method may further comprise determining an adjusted force signal based on feedback from the rotational position or force of the control arm to produce a preset force; and energizing the pair of torque coils with the adjusted force signal, thereby causing the probe tip to contact the surface of the sample with the preset force.

In some embodiments, the method may further comprise determining an adjusted force signal based on feedback from the rotational position or force of the control arm to position the probe tip at a preset height; energizing the pair of torque coils with the adjusted force signal, thereby causing the probe tip to be positioned at the preset height relative to the surface of the sample; and confirming that the probe tip is positioned at the preset height based on the sensing signal difference from the sensing subsystem.

In some embodiments, the method may further comprise generating a modulated force signal; and energizing the pair of torque coils with the modulated force signal, thereby causing the height of the probe tip to oscillate relative to the surface of the sample.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
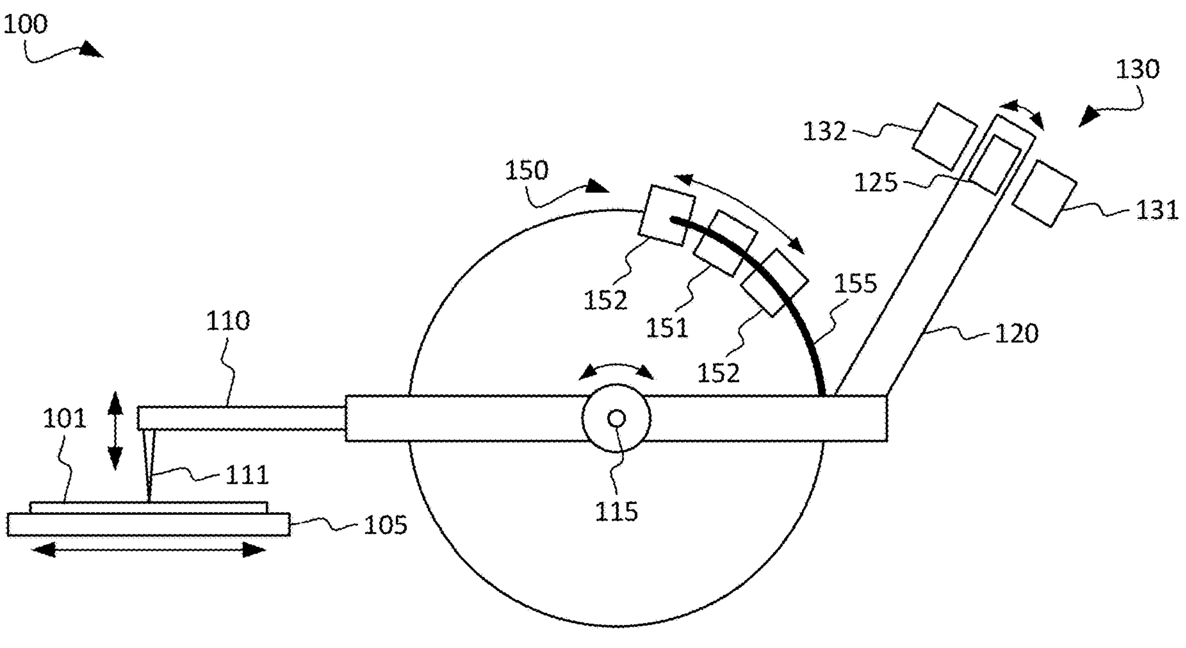
FIG. 1 is a diagram of a system according to an embodiment of the present disclosure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

An embodiment of the present disclosure provides a system 100, as shown in FIGS. 1-4. The system 100 may be a stylus profilometry system configured to measure the topography of a sample 101. The sample 101 may be planar or substantially planar and may have a slope or features that are within the dynamic range of the system 100. Such features may include, for example, machined metal parts, polished glass, lenses, mirrors, or the like. The sample 101 may be a semiconductor wafer including Silicon, GaAs, GaN, SiN, SiC, ceramic, substrate, display panel, coupon, metallic, inorganic, conductive, insulating, nonpatterned, patterned, relatively smooth, relatively rough, or other sample or workpiece which has a topographic surface and is encountered in industries including but not limited to semiconductor, power devices, MEMS devices, LED devices, auto industry and general process development across many material and device types. The system 100 may comprise a probe arm 110 having a probe tip 111 disposed at one end. The probe tip 111 may be comprised of diamond, sapphire, tungsten, layered, coated, or other materials or alloys which can hold their shape as they are scanned and can be fabricated into a probe shape. The probe tip 111 may be configured to contact a surface of the sample 101 to measure a series of individual points within the dynamic range of the system 100 (e.g., a point cloud), step heights and feature sizes on the surface of the sample 101 or to perform measurement of the topography of the surface. The probe tip 111 may have a tapered shape (e.g., conical, pyramidal, spherical, or other shape, steep walled or shallow) that may provide an upward force on the probe tip 111 when contacting a feature laterally during scanning or point-to-point contact to contact the surface of the sample 101 between narrow features and particles or manufactured features. The included cone angle of the probe tip 111 can vary from greater than 90° to less than 20°. The radius of the probe tip 111 can range from more than 50 micron to less than 40 nm, with a smaller radius enabling measurement of smaller geometries. A probe tip 111 having a smaller diameter can be more susceptible to damage and wear, which could benefit from the sensitive closed-loop servo system 100 of the present disclosure to reduce chance of wear and breakage. For example, the system 100 may allow smaller-sized probe tips 111 to be used, which can improve the resolution of the stylus, that otherwise would not be able to be achieved. Increased resolution can enable smaller feature sizes to be characterized, which may be beneficial to many industries.

The system 100 may further comprise a control arm 120. The control arm 120 may be connected to the probe arm 110. For example, the probe arm 110 may cantilever from the control arm 120. The control arm 120 may be configured to pivot about a pivot joint 115. Based on the connection between the probe arm 110 and the control arm 120, rotation of the control arm 120 about the pivot joint 115 may cause corresponding rotation of the probe arm 110 and the probe tip 111 connected thereto. The control arm 120 may comprise an internal magnet 125. The internal magnet 125 may be a permanent magnet disposed within the control arm 120 or connected to the control arm 120.

The system 100 may further comprise a pair of torque coils 130. The pair of torque coils 130 may be disposed on opposite sides of the internal magnet 125 of the control arm 120. For example, the pair of torque coils 130 may include a first torque coil 131 and a second torque coil 132, each disposed on opposite sides of the internal magnet 125 of the control arm 120. The pair of torque coils 130 may be configured to cause rotation of the control arm 120 about the pivot joint 115 based on interaction with the internal magnet 125, as further described below. Each torque coil of the pair of torque coils 130 may include one or more coils. In some embodiments, the pair of torque coils 130 may comprise a single torque coil.

The system 100 may further comprise a processor 140. The processor 140 may include a microprocessor, a microcontroller, FPGA, or other devices.

The processor 140 may be coupled to the components of the system 100 in any suitable manner (e.g., via one or more transmission media, which may include wired and/or wireless transmission media) such that the processor 140 can receive output. The processor 140 may be configured to perform a number of functions using the output. An inspection tool can receive instructions or other information from the processor 140. The processor 140 optionally may be in electronic communication with another inspection tool, a metrology tool, a repair tool, or a review tool (not illustrated) to receive additional information or send instructions.

The processor 140 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 140 may be disposed in or otherwise part of the system 100 or another device. In an example, the processor 140 and may be part of a standalone control unit or in a centralized quality control unit. Multiple processors 140 may be used, defining multiple subsystems of the system 100.

The processor 140 may be implemented in practice by any combination of hardware, software, and firmware. Also, its functions as described herein may be performed by one unit, or divided up among different components, each of which may be implemented in turn by any combination of hardware, software and firmware. Program code, instructions, configuration data, lookup tables, calibration data, and algorithms, etc. for the processor 140 to implement various methods and functions may be stored in readable storage media, such as a memory.

If the system 100 includes more than one subsystem, then the different processors 140 may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 140 may be configured to perform a number of functions using the output of the system 100 or other output. For instance, the processor 140 may be configured to send the output to an electronic data storage unit or another storage medium. The processor 140 may be further configured as described herein.

The processor 140 may be configured according to any of the embodiments described herein. The processor 140 also may be configured to perform other functions or additional steps using the output of the system 100 or using images or data from other sources.

The processor 140 may be communicatively coupled to any of the various components or sub-systems of system 100 in any manner known in the art. Moreover, the processor 140 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 140 and other subsystems of the system 100 or systems external to system 100. Various steps, functions, and/or operations of system 100 and the methods disclosed herein are carried out by one or more of the following: electronic circuits, logic gates, multiplexers, programmable logic devices, ASICs, FPGAs, analog or digital controls/switches, microcontrollers, or computing systems. Program instructions implementing methods such as those described herein may be transmitted over or stored on carrier medium. The carrier medium may include a storage medium such as a read-only memory, a random-access memory, a magnetic or optical disk, a non-volatile memory, a solid-state memory, a magnetic tape, and the like. A carrier medium may include a transmission medium such as a wire, cable, PCB trace, or wireless transmission link. For instance, the various steps described throughout the present disclosure may be carried out by a single processor 140 (or computer subsystem) or, alternatively, multiple processors 140 (or multiple computer subsystems). Moreover, different subsystems of the system 100 may include one or more computing or logic systems. Therefore, the above description should not be interpreted as a limitation on the present disclosure but merely an illustration.

Figure 2:
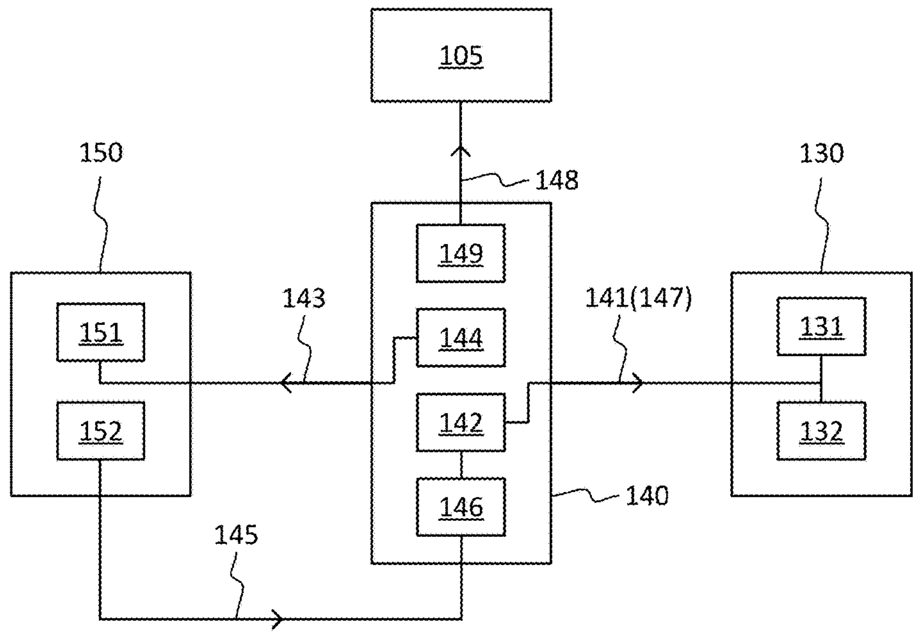
FIG. 2 is a schematic communication diagram of a processor according to an embodiment of the present disclosure.

As shown in FIG. 2, the processor 140 may be in electronic communication with the pair of torque coils 130 and other elements of the system 100. The processor 140 may be configured to energize at least one torque coil of the pair of torque coils 130 with a force signal 141 to generate a magnetic force between the pair of torque coils 130 and the internal magnet 125. In other words, when the force signal 141 is applied to at least one of the first torque coil 131 and the second torque coil 132, an electromagnetic field may be generated that may repel or attract the internal magnet 125 based on the magnitude and direction of the magnetic force applied to the internal magnet 125 from the electromagnetic field. The magnetic force may cause the control arm 120 to rotate about the pivot joint 115, thereby causing the probe arm 110 connected to the control arm 120 to rotate. Depending on the direction of the rotation, the magnetic force may cause the probe tip 111 to come down in contact the surface of the sample 101 or lift off the surface of the sample 101. The processor 140 may be configured to energize at least one of the first coil 131 and the second coil 132 with the force signal 141 to control the direction that the control arm 120 rotates about the pivot joint 115. In some embodiments, the processor 140 may be configured to energize both the first coil 131 and the second coil 132 with the force signal 141. The processor 140 may include a force signal generator 142 configured to generate the force signal 141. The magnetic force may be modulated by a control input circuit in order to adjust the down force being applied to the probe tip 111 as it is brought into contact with the surface of the sample 101 and while it is contact with the surface of the sample 101. In some embodiments, the first coil 131 and the second coil 132 may be connected in series, such that both the first coil 131 and the second coil 132 experience the same current, and each coil can produce a magnetic field in the same direction to produce a greater resultant force from the pair of torque coils 130. In some embodiments, the system 100 can include only one torque coil (e.g., one of the first coil 131 or the second coil 132), which can reduce the manufacturing cost of the system 100 by reducing the number of parts, and the single torque coil can be used to produce the magnetic force.

The system 100 may further comprise a sensing subsystem 150. The sensing subsystem 150 may be configured to measure the rotational position of the control arm 120. For example, the processor 140 may be configured to energize the sensing subsystem 150 with an excitation signal 143, and the sensing subsystem 150 may be configured to measure a sensing signal difference 145 based on the excitation signal 143. The processor 140 may include an excitation signal generator 144 configured to generate the excitation signal 143. The sensing signal difference 145 may correspond to the rotational position of the control arm 120, and more specifically, may correspond to a height of the probe tip 111 relative to the sample 101. The sensing signal difference 145 may be a voltage difference or a current difference.

Figure 3:
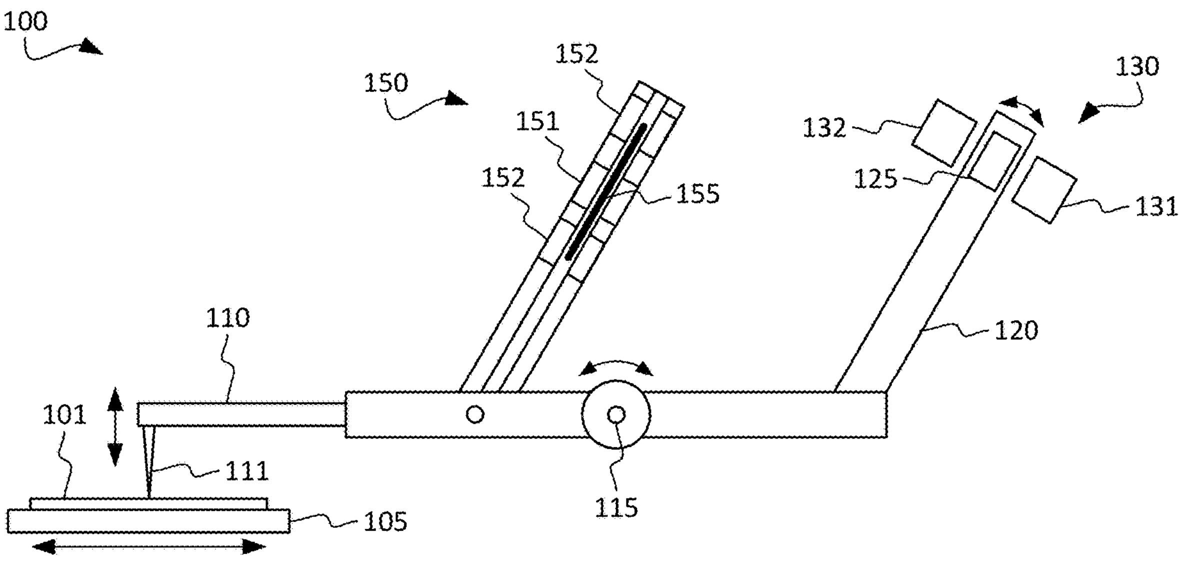
FIG. 3 is a diagram of a system according to another embodiment of the present disclosure.

In some embodiments, the sensing subsystem 150 may comprise a primary coil 151 and a pair of secondary coils 152, as shown in FIG. 1 and FIG. 3. For example, the sensing subsystem 150 may be a linear displacement sensor or an angular displacement sensor. The pair of secondary coils 152 may be disposed on opposite sides of the primary coil 151. The processor 140 may be configured to energize the primary coil 151 with the excitation signal 143, and the sensing subsystem 150 may be configured to measure the sensing signal difference 145 between the pair of secondary coils 152. The system 100 may further include a core 155 that is surrounded by the primary coil 151 and the pair of secondary coils 152. The core 155 can be made of a highly permeable and low hysteresis magnetic material such as, for example, a NiFe alloy, iron, or an iron alloy or the like, or other materials. The core 155 may be an extension of the probe arm 110, the pivot joint 115, or the control arm 120. A change in the rotational position of the control arm 120 may cause the core 155 to move within the primary coil 151 and the pair of secondary coils 152. The position of the core 155 relative to the pair of secondary coils 152 may affect the sensing signal difference 145 measured by the sensing subsystem 150. For example, a sensing signal difference 145 of zero may indicate that the core 155 is equidistant between the pair of secondary coils 152, as their relative voltages cancel each other out. However, as the core 155 moves in a direction closer to one of the secondary coils 152, the sensing signal difference 145 becomes non-zero, with the positive or negative value of the sensing signal difference 145 indicating the direction of the rotation of the control arm and the magnitude of the sensing signal difference 145 being proportional to the rotational position of the control arm 120 and the displacement of the probe tip 111.

In some embodiments, the sensing subsystem 150 may be configured as an angular displacement sensor, as shown in FIG. 1, which may measure rotary displacement of the core 155. For example, the primary coil 151 and the pair of secondary coils 152 may be cocircular along an arc 154, and the core 155 may move along the same arc 154 within the primary coils 151 and the pair of secondary coils 152. The position of the core 155 along the arc 154 relative to the pair of secondary coils 152 may be proportional to the rotational position of the control arm 120. Accordingly, the sensing signal difference 145 measured by the sensing subsystem 150 may correspond to the displacement of the probe tip 111. In an instance, both the primary coil 151 and the pair of secondary coils 152 may each have more than 1000 turns in their respective coils, which can increase the gain and sensitivity of the sensing subsystem 150.

In some embodiments, the sensing subsystem 150 may be configured as a linear displacement sensor as shown in FIG. 3, which may measure linear displacement of the core 155. For example, the primary coil 151 and the pair of secondary coils 152 may be coaxial along an axis 153, and the core 155 may move linearly within the primary coil 151 and the pair of secondary coils 152 along the same axis 153. The linear position of the core 155 along the axis 153 relative to the pair of secondary coils 152 may be proportional to the rotational position of the control arm 120. Accordingly, the sensing signal difference 145 measured by the sensing subsystem 150 may correspond to the displacement of the probe tip 111.

Figure 4:
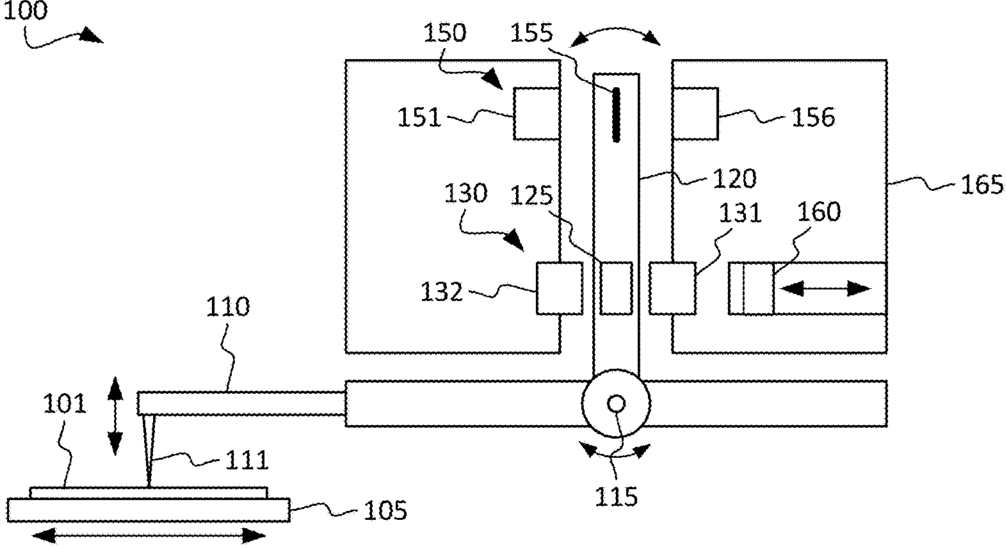
FIG. 4 is a diagram of a system according to another embodiment of the present disclosure.

In some embodiments, the sensing subsystem 150 may comprise a primary coil 151 and one secondary coil 156, as shown in FIG. 4. The secondary coil 156 may be disposed opposite to primary coil 151. The core 155 of the control arm 120 may be disposed between the primary coil 151 and the secondary coil 152. The processor 140 may be configured to energize the primary coil 151 with the excitation signal 143, and the sensing subsystem 150 may be configured to measure the sensing signal difference 145 from the secondary coil 152. A change in the rotational position of the control arm 120 may cause the core 155 to move relative to the primary coil 151 and the secondary coil 152. The position of the core 155 relative to the secondary coil 152 may affect the sensing signal difference 145 measured by the sensing subsystem 150. For example, as the core 155 moves in a direction closer to the primary coil 151 or the secondary coil 152, the magnitude of the sensing signal difference 145 may be proportional to the rotational position of the control arm 120 and the displacement of the probe tip 111.

In some embodiments, the system 100 may further comprise additional magnets that can cause the control arm 120 to retract to a reference or rest position. Such a function of the system 100 may be useful during power down conditions. While additional magnets can introduce a bias force, the system 100 can compensate for these forces. For example, as shown in FIG. 4, the system 100 may further comprise an external magnet 160. The external magnet 160 may be a permanent magnet configured to attract the internal magnet 125 of the control arm 120, which can cause the control arm 120 to rotate to a retracted position. In the retracted position, the probe tip 111 may be spaced apart from the surface of the sample 101, so as to prevent damage to the probe tip 111 when the system 100 is not in use. It should be understood that the pair of torque coils 130 may be configured to cause rotation of the control arm 120 against the attraction of the external magnet 160. In other words, since the external magnet 160 attracts the internal magnet 125, the magnetic force generated by the pair of torque coils 130 may be greater than the force from the external magnet 160 in order to rotate the control arm 120 in a direction for the probe tip 111 to contact the surface of the sample 101.

In some embodiments, the external magnet 160 may be movable within a housing 165 of the system 100 between a first position and a second position, as shown in FIG. 4. In the first position, the external magnet 160 may be proximal to the internal magnet 125 to attract the internal magnet 125 and cause the control arm 120 to rotate to the retracted position. In the second position, the external magnet 160 may be distal from the internal magnet 125, so as not to attract the internal magnet 125 and allow the control arm 120 to rotate freely. With the external magnet 160 in the second position, less magnetic force generated by the pair of torque coils 130 may cause the control arm 120 to rotate in a direction for the probe tip 111 to contact the surface of the sample 101. The position of the external magnet 160 may be manually adjustable (e.g., by a screw, sliding, or other movement mechanisms) and can be set to the first position or the second position during calibration of the system 100.

Figures 5A, 5B:
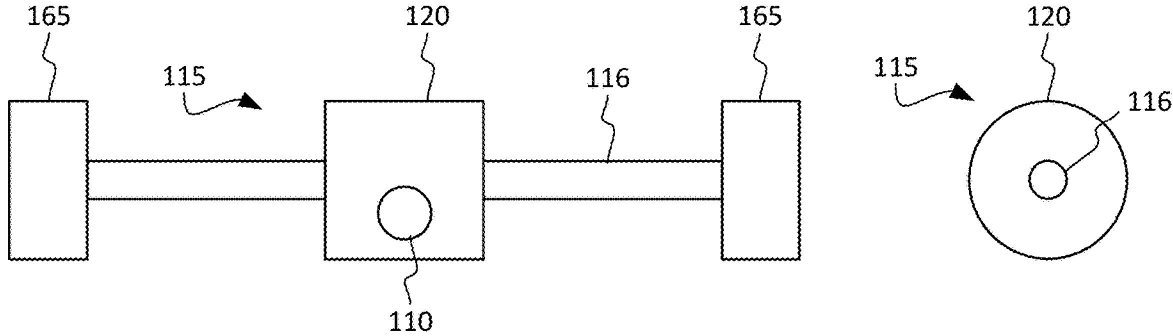
FIG. 5A is a longitudinal cross-section of a pivot joint of a system according to an embodiment of the present disclosure.
FIG. 5B is a cross-sectional view of the pivot joint of FIG. 5A.
Figures 6A, 6B:
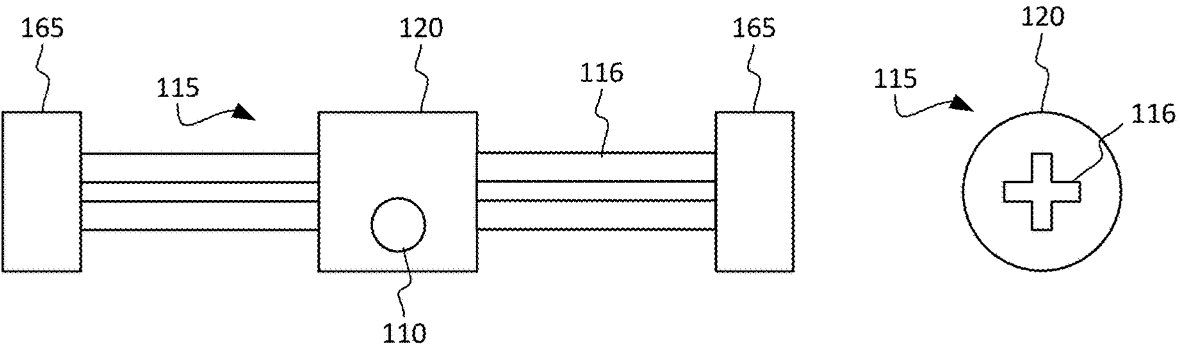
FIG. 6A is a longitudinal cross-section of a pivot joint of a system according to another embodiment of the present disclosure.
FIG. 6B is a cross-sectional view of the pivot joint of FIG. 6A.

In some embodiments, the pivot joint 115 may comprise a torsion bar 116 (as shown in FIGS. 5-6), a leaf spring, jewel or ruled bearing, or other type of biasing means for small angle pivoting. The torsion bar 116 may be connected at two ends to the housing 165, with the control arm 120 disposed in between. The torsion bar 116 may be configured to bias the control arm 120 toward a neutral position. In the neutral position, the probe tip 111 may be spaced apart from the surface of the sample 101, so as allow the sample 101 to be loaded and unloaded from the system 100 without damaging the probe tip 111 between processing steps. The angular range of the control arm 120 may depend on the length of the torsion bar 116, the length of the control arm 120, and manufacturing tolerances of the elements of the system 100 which can enable the probe tip 111 to be movable to the neutral position and to contact the surface of the sample 101. It should be understood that the pair of torque coils 130 may be configured to cause rotation of the control arm 120 against the bias for the torsion bar 116. In other words, since the torsion bar 116 is configured to bias the control arm toward the neutral position, the magnetic force generated by the pair of torque coils 130 may be greater than the force from the torsion bar 116 in order to rotate the control arm 120 in a direction away from the neutral position for the probe tip 111 to contact the surface of the sample 101. In some embodiments, the torsion bar 116 may have a circular cross-section, as shown in FIG. 5A and FIG. 5B. Alternatively, the torsion bar 116 may have a cross-shaped cross-section, as shown in FIG. 6A and FIG. 6B. A torsion bar 116 with a cross-shaped cross-section may have better rigidity on the non-rotational axes compared to a torsion bar 116 with a circular cross-section, and can minimize side-to-side motion of the control arm 120 and allow for accurate positioning. Increasing the length of the torsion bar 116 can also increase the stiffness while still allowing for sufficient angular degree of freedom. The height and thickness of the cross-sectional shape can also be tuned, as the height controls rigidity and the thickness prevents against buckling and non-desired modal shape response.

In some embodiments, the processor 140 may include a servo-loop integrator 146, as shown in FIG. 2. The servo-loop integrator 146 may be configured to apply the rotational position of the control arm 120 determined from the sensing subsystem 150 as feedback to control the force signal 141. For example, the servo-loop integrator 146 may receive the sensing signal difference 145 measured by the sensing subsystem 150 and may apply the feedback of the rotational position of the control arm 120 to the force signal generator 142 to adjust the force signal 141. In other words, the servo-loop integrator 146 may provide closed loop operation of the system 100 for precise positioning and force control of the probe tip 111. The servo-loop integrator 146 can be configured to control against mechanical resonance frequencies. The servo-loop integrator 146 may be further configured to control the settling time of the position of the probe tip 111. For example, if the probe tip 111 is traversing the surface of the sample 101 quickly, the servo-loop integrator 146 may provide feedback to the system 100 to actively damp against mechanical resonance of the control arm 120 and torsion bar 116, so as not to restrict against moving the control arm 120 up and down at a given frequency.

In an example, the processor 140 may be configured to determine an adjusted force signal 141 based on feedback from the rotational position or force of the control arm 120 to produce a preset force. The feedback may indicate that the control arm 120 is at a position in which the probe tip 111 is in contact with the surface of the sample 101, such that further rotation of the control arm 120 will apply force to the surface of the sample 101 with the probe tip 111. Accordingly, the processor 140 may determine the adjusted force signal 141 that will produce the preset force. The processor 140 may be further configured to energize at least one torque coil of the pair of torque coils 130 with the adjusted force signal 141, thereby causing the probe tip 111 to contact the surface of the sample 101 with the preset force. The preset force may be adapted based on the material of the sample 101, for example, to contact the sample 101 with the probe tip 111 for with an appropriate force to measurement soft and hard materials. The preset force may help minimize wear of the probe tip 111, make it easier to scan soft samples, and can also protect the sample 101 under test.

In another example, the processor 140 may be configured to determine an adjusted force signal 141 based on feedback from the rotational position or force of the control arm 120 to position the probe tip 111 at a preset height. The feedback may indicate that the control arm 120 is at a position in which the probe tip 111 is at a height different from the preset height, such that further rotation of the control arm 120 will move the probe tip 111 to be positioned at the preset height. Accordingly, the processor 140 may determine the adjusted force signal 141 that will position the probe tip 111 at the preset height based on the presently measured position. The processor 140 may be further configured to energize at least one torque coil of the pair of torque coils 130 with the adjusted force signal 141, thereby causing the control arm 120 to rotate and position the probe tip 111 at the preset height. The processor 140 may be further configured to confirm that the probe tip 111 is positioned at the preset height based on the sensing signal difference 145 received from the sensing subsystem 150. The feedback information may therefore allow for precise positioning of the probe tip 111 and constant adjustment of the force signal 141 during measurements. The precise position can enable measurement of fragile samples or samples with small feature heights or roughness.

In some embodiments, the processor 140 may be configured to generate a modulated force signal 147. For example, the force signal generator 142 may be configured to generate the modulated force signal 147. Alternatively, the processor 140 may further include a filter configured to modulate the force signal 141 generated by the force signal generator 142 to produce the modulated force signal 147. The modulated force signal 147 may be applied to the primary coil 151. The modulated force signal 147 may be an oscillating signal. The processor 140 may be further configured to energize at least one torque coil of the pair of torque coils 130 with the modulated force signal 147, which may cause the internal magnet 125 to oscillate between the pair of torque coils 130 and may cause the probe tip 111 to oscillate relative to the surface of the sample 101. By oscillating up and down, the probe tip 111 may have a reduced chance of being stuck in a sample 101 having high stickiness. This may also reduce wear on the probe tip 111 and allow for smaller and more fragile samples to be scanned.

In some embodiments, the processor 140 may be configured to cause the probe tip 111 to make contact with the surface of the sample 101 at a single point, and then lift off the surface of the sample 101 to a safe height using the pair of torque coils 130, and translate the probe tip 111 to a second position, and bring the probe tip 111 into contact with the surface of the sample 101 at a constant force, and continue point contact for a number of other locations on the surface of the sample 101 to generate a point cloud, which can be used to generate an absolute height map. This may reduce wear on the probe tip 111, increase the measurement throughput, particularly for a large sample 101, can allow for larger and smaller samples 101 to be measured where scanning is not required for a measurement, and can allow for scanning fragile samples 101 or adhesive samples 101 where constant in contact scanning is not practical.

In some embodiments, the processor 140 may be configured to dynamically compensate for the spring constant of the sensing subsystem 150 in real-time through the full dynamic range of the height sensor. This may also reduce wear on the probe tip 111 and allow for smaller and more fragile samples 101 to be scanned and reduce the error of the measured surface height.

In some embodiments, the sample 101 may be disposed on a stage 105. The stage 105 may be moveable in one or more directions in-plane (i.e., x and y directions) or out-of-plane (i.e., z direction) by one or more actuators. The processor 140 may be configured to send instructions 148 to the stage 105 via a transceiver 149 to position the sample 101 by moving the one or more actuators. For example, the processor 140 may be configured to send instructions 148 to move the stage 105 to scan the probe tip 111 across the surface of the sample 101, and the rotational position of the control arm 120 measured by the sensing subsystem 150 may indicate the topography of the sample 101 in the scanning direction. The processor 140 may be configured to control the speed of the movement of the stage 105, in which a faster scan speed can increase throughput and a slower scan speed can increase measurement accuracy. The processor 140 may be further configured to set the preset force and/or the preset height for the probe tip 111 during the scan, as described above.

With the system 100, the rotational position of the control arm 120 can be controlled via the force signal 141 applied to the pair of torque coils 130, and the sensing subsystem 150 can determine the rotational position of the control arm 120 to provide feedback for closed loop control. Accordingly, the system 100 can provide precise position and force control in an integrated system.

Figure 7:
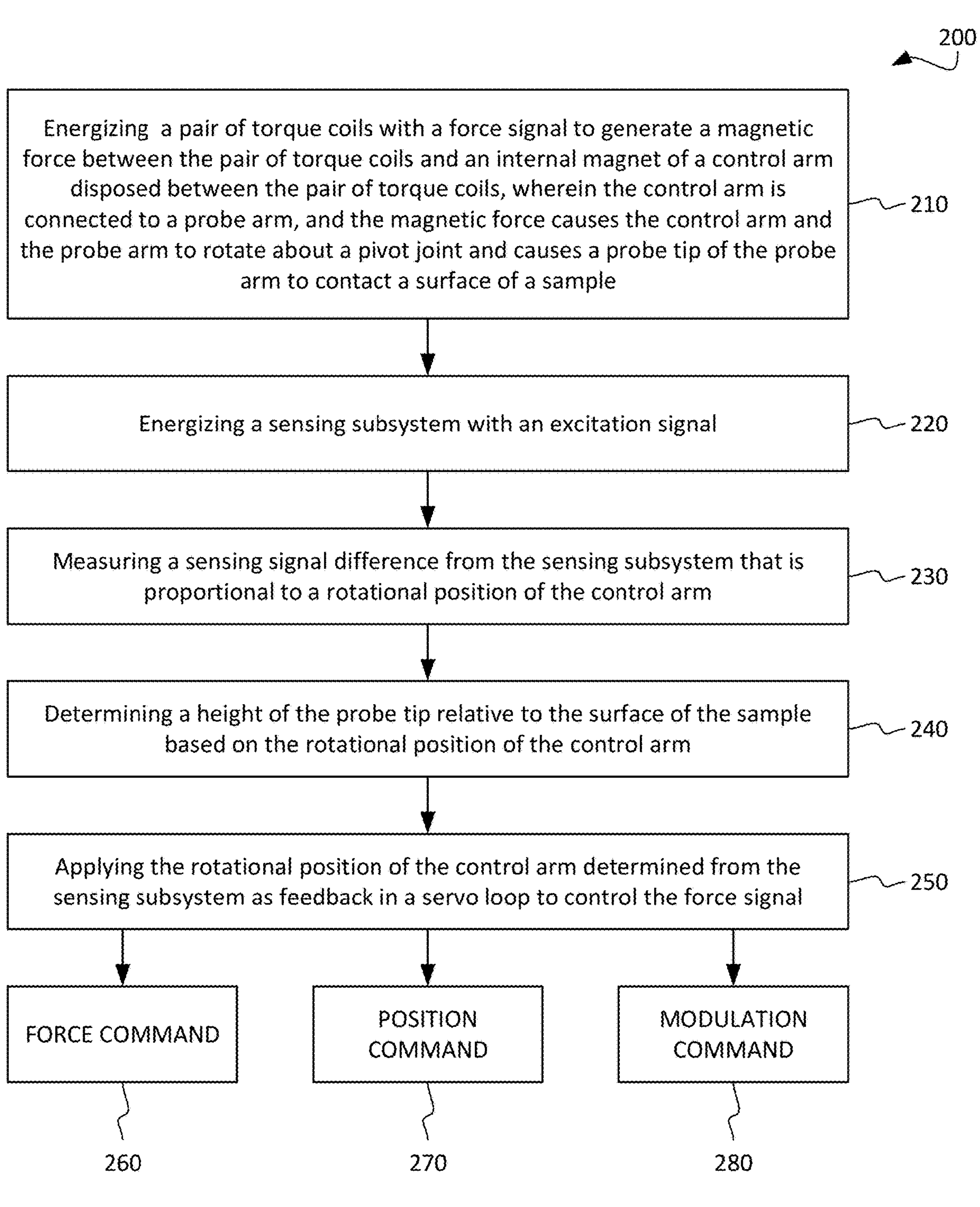
FIG. 7 is a flowchart of a method according to an embodiment of the present disclosure.

Another embodiment of the present disclosure provides a method 200. As shown in FIG. 7, the method 200 may comprise the following steps.

At step 210, a pair of torque coils are energized with a force signal to generate a magnetic force between the pair of torque coils and an internal magnet of a control arm disposed between the pair of torque coils. The control arm may be connected to a probe arm, and the magnetic force may cause the control arm and the probe arm to rotate about a pivot joint and may cause a probe tip of the probe arm to contact a surface of a sample.

In an embodiment, step 210 may comprise energizing one torque coil of the pair of torque coils with the force signal to control a direction that the control arm rotates about the pivot joint based on the magnetic force. For example, one of the torque coils may be energized to attract or repel the internal magnet of the control arm to rotate the control arm in a controlled direction. Alternatively, step 210 may comprise energizing both torque coils with different force signals to control a direction that the control arm rotates about the pivot joint based on the magnetic force. For example, each torque coil may be energized such that they attract/repel the internal magnet of the control arm to rotate the control arm in a controlled direction. Each torque coil may be energized such that a resultant magnetic force from both torque coils controls the direction of rotation of the control arm.

At step 220, a sensing subsystem is energized with an excitation signal. The sensing subsystem may be configured according to any of the embodiments of the system 100 described above, e.g., as an angular displacement sensor, a linear displacement sensor, two coil structure, or other sensor configuration.

At step 230, a sensing signal difference from the sensing subsystem is measured. The sensing signal difference may be proportional to a rotational position of the control arm. The sensing signal difference may be a voltage difference or a current difference. Specifically, a change in the rotational position of the control arm may cause an iron core of the control arm to move relative to a primary coil and a pair of secondary coils. By measuring the sensing signal difference at the pair of secondary coils, the direction and magnitude of the rotation of the control arm can be determined.

At step 240, a height of the probe tip relative to the surface of the sample is determined based on the rotational position of the control arm. For example, based on the rotation of the control arm, the corresponding rotational position of the probe arm can indicate the height of the probe tip. Based on contact made with the sample, the height of the probe tip relative to the surface of the sample and the height of surface features of the sample can be determined.

At step 250, the rotational position of the control arm determined from the sensing subsystem is applied as feedback in a servo loop to control the force signal. In other words, the rotational position of the control arm may be used to provide closed loop operation for precise positioning and force control of the probe tip, as further described below.

Figures 8, 9, 10:
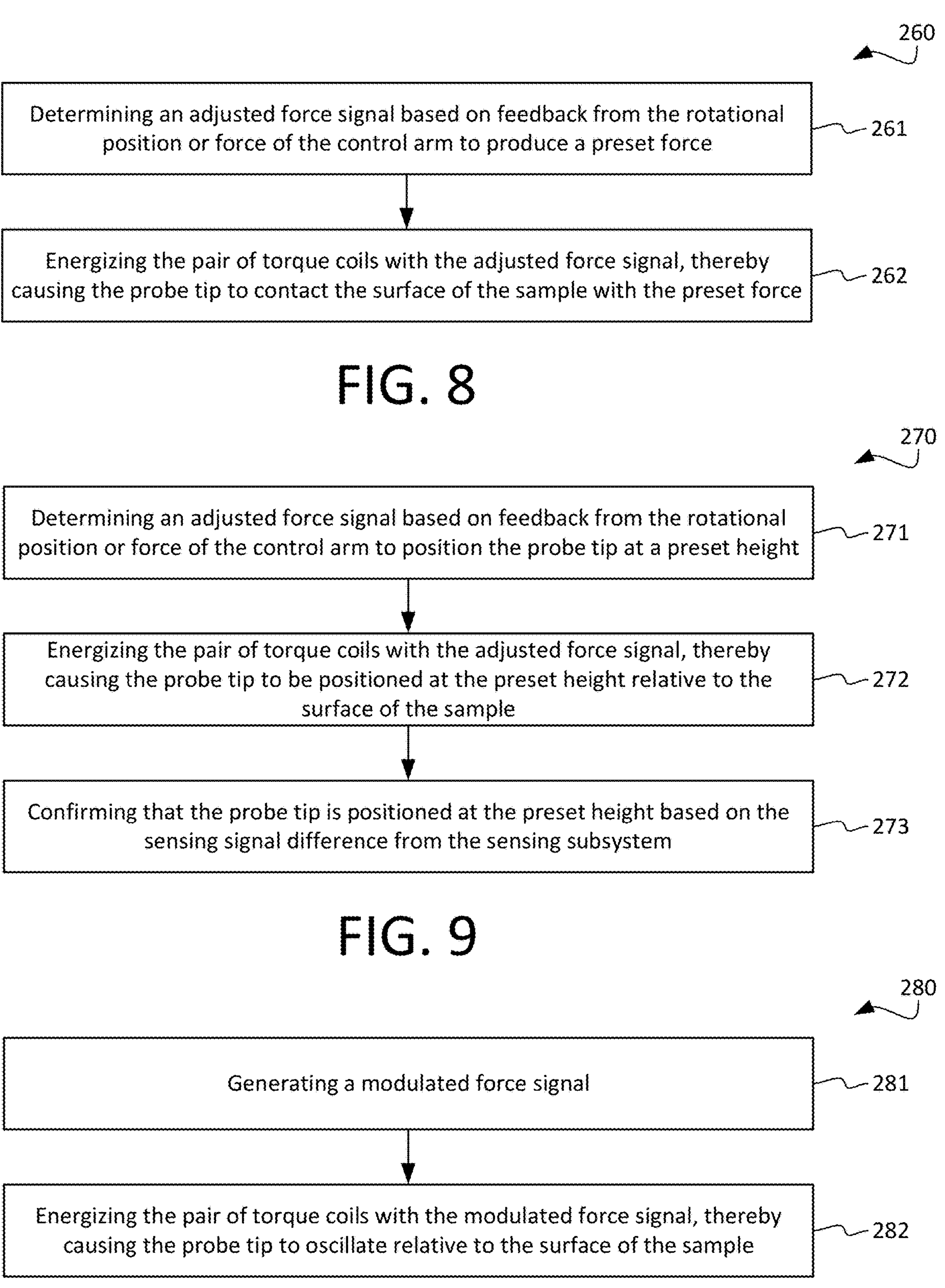
FIG. 8 is a flowchart of the method steps of a force command in the method of FIG. 7.
FIG. 9 is a flowchart of the method steps of a position command in the method of FIG. 7.
FIG. 10 is a flowchart of the method steps of a modulation command in the method of FIG. 7.

In some embodiments, the method 200 may further comprise a force command 260. The force command 260 may cause the probe tip to apply a controlled force to the surface of the sample, for example, for use in scratch testing or indentation testing of the sample. Upon receiving the force command 260, the method 200 may include the following additional steps shown in FIG. 8.

At step 261, an adjusted force signal is determined based on feedback from the rotational position or force of the control arm to produce a preset force. For example, based on the position information of the control arm, it may be determined when the probe tip is in contact with the surface of the sample and what additional rotation of the control arm will cause the probe tip to apply the preset force to the sample. Accordingly, the adjusted force signal may be an adjustment to the force signal applied to at least one torque coil of the pair of torque coils (e.g., increase or decrease) that will cause the control arm to rotate to produce the preset force.

At step 262, the pair of torque coils are energized with the adjusted force signal, thereby causing the probe tip to contact the surface of the sample with the preset force. The force applied to the sample may be confirmed to be the preset force based on the sensing signal difference from the sensing subsystem. The closed loop feedback of the method 200 may allow precise control of the force applied to the surface of the sample by the probe tip for scratch and indentation testing.

In some embodiments, the method 200 may further comprise a position command 270. The position command 270 may be configured to position the probe tip at a preset height relative to the surface of the sample for precise positioning and measurements. Upon receiving the position command 270, the method 200 may include the following additional steps shown in FIG. 9.

At step 271, an adjusted force signal is determined based on feedback from the rotational position or force of the control arm to position the probe tip at a preset height. For example, based on the position information of the control arm, it may be determined where the current position of the probe tip is and what additional rotation of the control arm will cause the probe tip to be positioned at the preset height. Accordingly, the adjusted force signal may be an adjustment to the force signal applied to at least one torque coil of the pair of torque coils (e.g., increase or decrease) that will cause the control arm to rotate to position the probe tip at the preset height.

At step 272, the pair of torque coils are energized with the adjusted force signal, thereby causing the probe tip to be positioned at the preset height relative to the surface of the sample.

At step 273, the position of the probe tip is confirmed to be at the preset height based on the sensing signal difference from the sensing subsystem. The closed loop feedback of the method 200 may allow precise control of the position of the probe tip for precise positioning and measurement of features on the surface of the sample.

In some embodiments, the method 200 may further comprise a modulation command 280. The modulation command 280 may be configured to oscillate the probe tip relative to the surface of the sample. Upon receiving the modulation command 280, the method 200 may include the following additional steps shown in FIG. 10.

At step 281, a modulated force signal is generated. The modulated force signal may reverse or interrupt the force signal applied to the pair of torque coils in a periodic manner. Accordingly, the modulated force signal may be a separate signal from the force signal or may be produced by passing the force signal through a filter to generate the modulated force signal.

At step 282, the pair of torque coils are energized with the adjusted force signal, thereby causing the probe tip to oscillate relative to the surface of the sample. By oscillating up and down, the probe tip may have a reduced chance of being stuck in a sample having high stickiness.

With the method 200, the rotational position of the control arm can be controlled via the force signal applied to the pair of torque coils, and the sensing subsystem can determine the rotational position of the control arm to provide feedback for closed loop control. Accordingly, the method 200 can provide precise position and force control in an integrated system.

Figure 11:
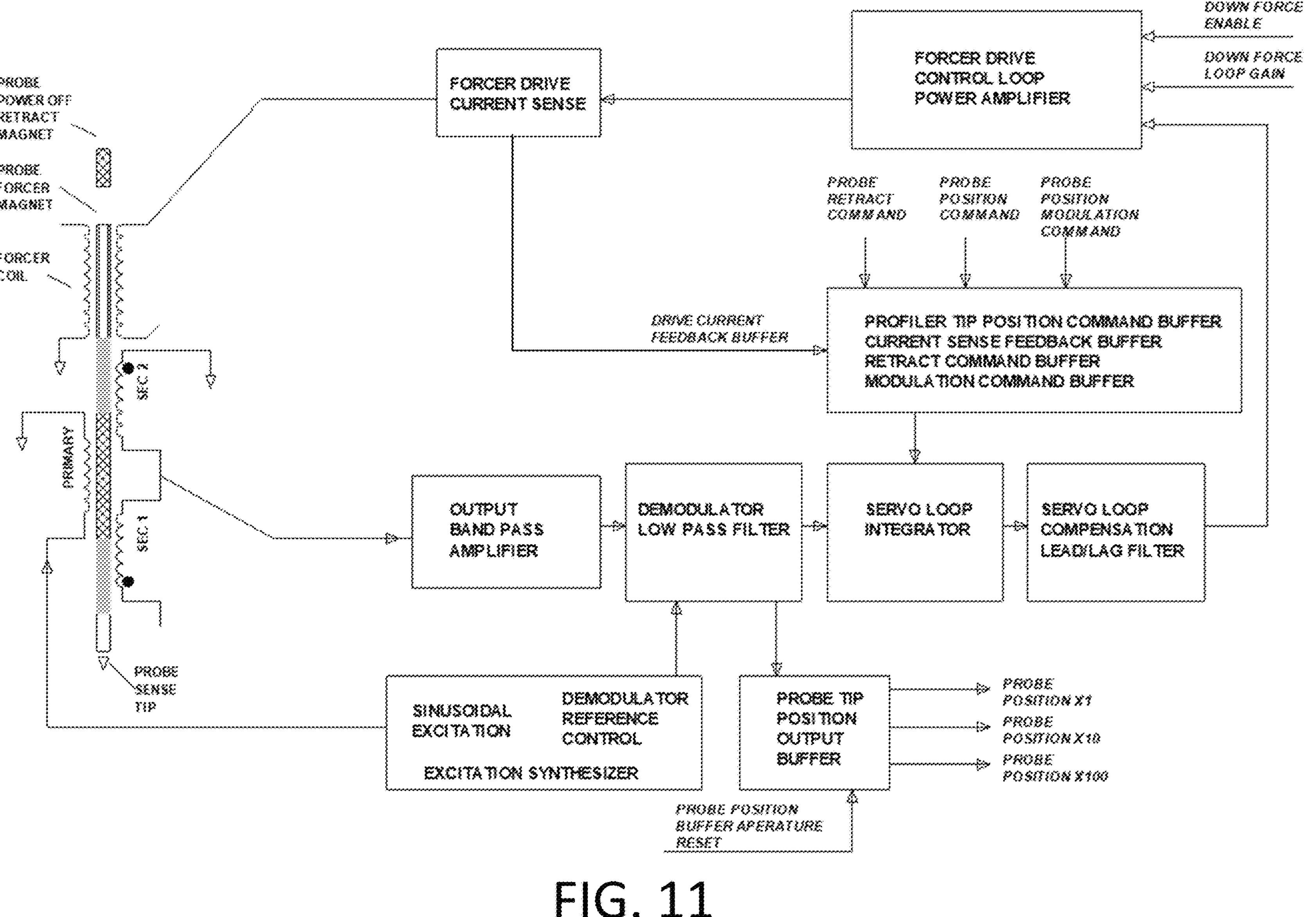
FIG. 11 is a block diagram of a control system according to an embodiment of the present disclosure.

A block diagram of a control system of a precision stylus is shown in FIG. 11. The control system may be a closed-loop system, and may be applicable to any of the embodiments of the system 100 and the method 200 described herein. The elements of the control system shown in FIG. 11 are further described below.

The control system may comprise a probe sense tip. The probe sense tip may correspond to the probe tip 111 of the system 100 described above.

The control system may further comprise a position sensor excitation synthesizer. The position sensor excitation signal synthesizer can create a pure sine wave to drive the primary coil. The position sensor excitation signal synthesizer may correspond to the excitation signal generator 144 configured to generate the excitation signal 143 of the system 100 described above.

The control system may further comprise position sensor primary coil and position sensor secondary coils. The position sensor primary coil may be driven with a sinusoidal current drive that induces an alternating magnetic flux in the movable core that travels with the profiler probe tip. The sensor core may travel between the secondary coils. The alternating magnetic flux in the core induced by the primary winding couples differentially into the secondary windings. The position sensor primary coil may correspond to the primary coil 151 of the system 100 described above, and the position sensor secondary coils may correspond to the pair of secondary coils 152 of the system 100 described above.

The control system may further comprise a position sensor buffer amplifier. The position sensor buffer amplifier may extract the combined signal from the sensor coils that is proportional to the magnitude of the position and has a phase that indicates the sign of the position with respect to the center of the sensor travel.

The control system may further comprise a forcer coil. The forcer coil may induce a bidirectional force on the magnet mounted in the probe shaft to allow for closed loop damping of probe tip motion. The forcer coil can be used to induce a precise pressure on the probe tip that is in contact with the test sample. The forcer coil may correspond to the pair of torque coils 130 of the system 100 described above.

The control system may further comprise a retractor magnet. The retractor magnet may be positioned above the probe shaft magnet that induces a slight attraction on the shaft when the unit is not powered. The retractor function may protect the test sample and the probe tip in the event of a loss of power in the system. The retractor magnet may correspond to the external magnet 160 of the system 100 described above.

The control system may further comprise a position sensor signal demodulator and low pass filter. The demodulator may convert the probe tip position signal from a sinusoidal waveform into a direct voltage wave form. The demodulator may be coupled with the low pass filter that can remove the residual ripple from the probe position signal.

The control system may further comprise a servo loop integrator. The servo loop integrator may drive the probe tip to a null position. The control system may further comprise a servo loop lead/lag filter compensator. The lead lag filter may be used to correct the phase and gain of the of the probe position servo loop. The control system may further comprise a servo loop forcer drive power amplifier. The servo loop power amplifier may drive the forcer coils to force the sensor shaft to the desired position. The loop power amplifier may have an input to enable the down force drive current.

The control system may further comprise a profiler tip position command and feedback buffer. The command buffer may interface with the host system to activate the down force function, the modulation function, and the retract function as well as providing a path out for the current feedback signal. The current feedback signal may be proportional to the force that is driving the probe down force. The servo loop modulation signal may allow for the probe tip to be driven with a variable signal to enable a tapping motion.

The control system may further comprise a probe position output buffer. The probe position output buffer may perform final compensation of the position output, perform any linearity compensation as needed, and provide multiple gain amplifiers to allow the sensitivity to be selectable by the user. Higher gain stages may further utilize offset circuitry that shifts the data into the output voltage aperture. The unity gain output may be directly proportional to the probe position. For example, 10 volts may be proportional to a 2 mm range of the probe tip. The gain of 10 position output may provide a position output with 10 times the sensitivity. For example, 10 volts may be proportional to 200 microns of probe deflection. A nulling circuit may allow for the 10-volt output window to be shifted along the virtual 100-volt range. The gain of 100 position output may provide a position output with 100 times the sensitivity. For example, 10 volts is proportional to 20 microns of probe deflection. A nulling circuit allows for the 10-volt output window to be shifted along the virtual 1000-volt range. The probe position signal may be the filtered output of the demodulator which is directly proportional to the position of the probe tip.

The control system may further comprise a probe position buffer aperture reset. The aperture reset may allow the user to shift the aperture window into the range that can be displayed by the test system.

A down force enable signal may connect the down force signal into the control loop. A down force loop enable can control the integral gain of the control loop. In low gain mode, the integrator may be disabled. A forcer drive current sense signal may be feed back into the control loop to allow constant down force to be regulated. A demodulator reference signal may be synchronized with the excitation signal to allow precise control of the phase of the demodulator process.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:

a probe arm comprising a probe tip, wherein the probe tip is configured to contact a surface of a sample;

a control arm connected to the probe arm, wherein the control arm includes an internal magnet;

one or more torque coils disposed on opposite sides of the internal magnet of the control arm, wherein the one or more torque coils are configured to cause rotation of the control arm about a pivot joint based on interaction with the internal magnet;

a sensing subsystem configured to measure a rotational position of the control arm; and a processor in electronic communication with the one or more torque coils and the sensing subsystem, wherein the processor is configured to:

energize at least one of the one or more torque coils with a force signal to generate a magnetic force between the one or more torque coils and the internal magnet, which causes the control arm to rotate about the pivot joint, thereby causing the probe arm connected to the control arm to rotate about the pivot joint and causing the probe tip to contact the surface of the sample;

energize the sensing subsystem with an excitation signal; and receive a sensing signal difference from the sensing subsystem that is proportional to the rotational position of the control arm, which corresponds to a height of the probe tip relative to the surface of the sample, wherein the sensing signal difference is a voltage difference or a current difference.

2. The system of claim 1, wherein the processor includes a servo loop integrator configured to apply the rotational position of the control arm determined from the sensing subsystem as feedback to control the force signal.

3. The system of claim 1, wherein the processor is further configured to:

determine an adjusted force signal based on feedback from the rotational position or force of the control arm to produce a preset force; and energize at least one of the one or more torque coils with the adjusted force signal, thereby causing the probe tip to contact the surface of the sample with the preset force.

4. The system of claim 1, wherein the processor is further configured to:

determine an adjusted force signal based on feedback from the rotational position or force of the control arm to position the probe tip at a preset height;

energize at least one of the one or more torque coils with the adjusted force signal, thereby causing the probe tip to be positioned at the preset height relative to the surface of the sample; and confirm that the probe tip is positioned at the preset height based on the sensing signal difference received from the sensing subsystem.

5. The system of claim 1, wherein the processor is further configured to:

generate a modulated force signal; and energize at least one of the one or more torque coils with the modulated force signal, thereby causing the height of the probe tip to oscillate relative to the surface of the sample.

6. The system of claim 1, wherein the sensing subsystem comprises:

a primary coil; and a pair of secondary coils disposed on opposite sides of the primary coil;

wherein a core of the pivot joint is surrounded by the primary coil and the pair of secondary coils, such that a change in the rotational position of the control arm causes the core to move within the primary coil and the pair of secondary coils, and the sensing signal difference measured from the pair of secondary coils is proportional to a position of the core.

7. The system of claim 6, wherein the primary coil and the pair of secondary coils are coaxial, and the core moves linearly within the primary coil and the pair of secondary coils.

8. The system of claim 6, wherein the primary coil and the pair of secondary coils are cocircular, and the core moves angularly within the primary coil and the pair of secondary coils.

9. The system of claim 1, wherein the sensing subsystem comprises:

a primary coil; and a secondary coil disposed opposite to the primary coil;

wherein a core of the control arm is disposed between the primary coil and the secondary coil, such that a change in the rotational position of the control arm causes the core to move between the primary coil and the secondary coil, and the sensing signal difference measured from the secondary coil is proportional to a position of the core.

10. The system of claim 1, further comprising an external magnet configured to attract the internal magnet of the control arm, which causes the control arm to rotate to a retracted position, in which the probe tip is spaced apart from the surface of the sample.

11. The system of claim 10, wherein the one or more torque coils are configured to cause rotation of the control arm against the attraction of the external magnet.

12. The system of claim 10, wherein the external magnet is movable between a first position and a second position, in which in the first position, the external magnet is proximal to the internal magnet to attract the internal magnet of the control arm, and in the second position, the external magnet is distal from the internal magnet to allow free rotation of the control arm.

13. The system of claim 1, wherein the pivot joint includes a torsion bar configured to bias the control arm toward a neutral position, in which the probe tip is spaced apart from the surface of the sample, and the one or more torque coils are configured to cause rotation of the control arm against the bias of the torsion bar.

14. The system of claim 1, wherein the processor is further configured to:

energize one of the one or more torque coils with the force signal to control a direction that the control arm rotates about the pivot joint based on the magnetic force.

15. A method comprising:

energizing a pair of torque coils with a force signal to generate a magnetic force between the pair of torque coils and an internal magnet of a control arm disposed between the pair of torque coils, wherein the control arm is connected to a probe arm, and the magnetic force causes the control arm and the probe arm to rotate about a pivot joint and causes a probe tip of the probe arm to contact a surface of a sample;

energizing a sensing subsystem with an excitation signal;

measuring a sensing signal difference from the sensing subsystem that is proportional to a rotational position of the control arm, wherein the sensing signal difference is a voltage difference or a current difference; and determining a height of the probe tip relative to the surface of the sample based on the rotational position of the control arm.

16. The method of claim 15, further comprising:

applying the rotational position of the control arm determined from the sensing subsystem as feedback in a servo loop to control the force signal.

17. The method of claim 15, further comprising:

determining an adjusted force signal based on feedback from the rotational position or force of the control arm to produce a preset force; and energizing the pair of torque coils with the adjusted force signal, thereby causing the probe tip to contact the surface of the sample with the preset force.

18. The method of claim 15, further comprising:

determining an adjusted force signal based on feedback from the rotational position or force of the control arm to position the probe tip at a preset height;

energizing the pair of torque coils with the adjusted force signal, thereby causing the probe tip to be positioned at the preset height relative to the surface of the sample; and confirming that the probe tip is positioned at the preset height based on the sensing signal difference from the sensing subsystem.

19. The method of claim 15, further comprising:

generating a modulated force signal; and energizing the pair of torque coils with the modulated force signal, thereby causing the height of the probe tip to oscillate relative to the surface of the sample.

20. The method of claim 15, wherein energizing the pair of torque coils with the force signal comprises:

energizing one torque coil of the pair of torque coils with the force signal to control a direction that the control arm rotates about the pivot joint based on the magnetic force.

* * * * *